US012774520B2

(12) United States Patent
Gupta et al.

(10) Patent No.: US 12,774,520 B2
(45) Date of Patent: Oct. 27, 2026

(54) METAL-ORGANIC CHEMICAL VAPOR DEPOSITION OF SEMI-INSULATING IRON-DOPED GROUP III-NITRIDE FILMS

(71) Applicant: Wisconsin Alumni Research Foundation, Madison, WI (US)

(72) Inventors: Chirag Gupta, Middleton, WI (US); Swarnav Mukhopadhyay, Madison, WI (US); Shubhra Shweta Pasayat, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 18 days.

(21) Appl. No.: 18/659,127

(22) Filed: May 9, 2024

(65) Prior Publication Data

US 2025/0346993 A1 Nov. 13, 2025

(51) Int. Cl.
*C23C 16/34* (2006.01)
*C23C 16/455* (2006.01)

(52) U.S. Cl.
CPC ........ *C23C 16/34* (2013.01); *C23C 16/45523* (2013.01)

(58) Field of Classification Search
None
See application file for complete search history.

(56) References Cited

U.S. PATENT DOCUMENTS

2010/0117118 A1* 5/2010 Dabiran ............. H10D 30/4755 257/190
2021/0384336 A1* 12/2021 Enatsu .................. C30B 29/406

OTHER PUBLICATIONS

Feng, et al., "Influence of Fe-doping on GaN grown on sapphire substrates by MOCVD," Journal of Crystal Growth, Sep. 11, 2007, pp. 8-11, vol. 309, doi:10.1016/j.jcrysgro.2007.08.032.
Brown, et al., "Electrical properties of N-polar AlGaN/GaN high electron mobility transistors grown on SiC by metalorganic chemical vapor deposition,"Applied Physics Letters, Apr. 16, 2009, 4 pages, vol. 94, doi.org/10.1063/1.3122347.
Cui, et al., "The influence of Fe doping on the surface topography of GaN epitaxial material," Journal of Semiconductors, Oct. 2015, 5 pages, vol. 36, No. 10, doi: 10.1088/1674-4926/36/10/103002.
Heikman, "MOCVD Growth Technologies for Applications in AlGaN/GaN High Electron Mobility Transistors," Sep. 2002, 203 pages.
Dai, et al., "The Effect of Heavy Fe-Doping on 3D Growth Mode and Fe Diffusion in GaN for High Power HEMT Application," Materials, Mar. 10, 2022, 10 pages, vol. 15, doi.org/10.3390/ma15062058.

(Continued)

*Primary Examiner* — Kim S. Horger
(74) *Attorney, Agent, or Firm* — Bell & Manning, LLC

(57) ABSTRACT

Methods for growing semi-insulating, Fe-doped group III-nitrides on a substrate via MOCVD are provided. In the methods, the introduction of Fe dopants into the growing group III-nitride film is delayed until after the group III-nitride film has begun coalescence. The Fe dopants are then introduced into the growing film in a stepwise process, whereby an Fe dopant precursor is introduced at a high flow rate, followed by the reduction of the Fe dopant precursor flow rate in a subsequent step. Finally, once the Fe dopant precursor flow is stopped, the flow of a nitrogen precursor is increased to reduce the Fe dopant tail in the group III-nitride.

25 Claims, 6 Drawing Sheets

(56) References Cited

OTHER PUBLICATIONS

Huang, et al., "The Characteristics of 6-Inch GaN on Si RF HEMT with High Isolation Composited Buffer Layer Design," Electronics, Dec. 30, 2020, 7 pages, vol. 10, No. 46, doi.org/10.3390/electronics10010046.

Keller, et al., "Recent progress in metal-organic chemical vapor deposition of (0001) N-polar group-III nitrides," Semiconductor Science and Technology, Aug. 20, 2014, 47 pages, vol. 29, doi:10.1088/0268-1242/29/11/113001.

Arteev, et al., "Influence of doping profile of GaN: Fe buffer layer on the properties of AlGaN/AlN/GaN heterostructures for high-electron mobility transistors," Journal of Physics: Conference Series, 2020, 10 pages, doi:10.1088/1742-6596/1697/1/012206.

Heikman, et al., "Growth and characteristics of Fe-doped GaN," Journal of Crystal Growth, 2003, pp. 513-517, vol. 248.

Bisi, et al., "Commercially Available N-polar GaN HEMT Epitaxy for RF Applications," 2021 IEEE 8th Workshop on Wide Bandgap Power Devices and Applications (WiPDA), 5 pages, doi: 10.1109/WiPDA49284.2021.9645102.

Heikman, et al., "Growth of Fe doped semi-insulating GaN by metalorganic chemical vapor deposition," Applied Physics Letters, Jul. 2, 2002, pp. 439-441, vol. 81, doi.org/10.1063/1.1490396.

* cited by examiner

METAL-ORGANIC CHEMICAL VAPOR DEPOSITION OF SEMI-INSULATING IRON-DOPED GROUP III-NITRIDE FILMS

REFERENCE TO GOVERNMENT RIGHTS

This invention was made with government support under N00014-22-1-2267 awarded by the NAVY/ONR. The government has certain rights in the invention.

BACKGROUND

There is growing interest in gallium nitride (GaN) as a material for high-frequency and high-power applications, such as high electron mobility transistors (HEMTs) and other field effect transistors (FETs), due to its large band gap and high internal breakdown field. Unfortunately, GaN layers grown by current methods, such as metalorganic vapor phase epitaxy (MOVPE), result in dislocations and donor-like-impurities, such as residual oxygen or nitrogen vacancies, which cause n-type conductivity in unintentionally doped GaN. For GaN on oxygen-containing substrates, such as sapphire, oxygen incorporation is more problematic for N-polar GaN than for Ga-polar GaN, due to the higher nucleation temperature of the former.

Semi-insulating GaN is used as a buffer layer between a substrate and the active region of electronic devices to reduce leakage currents. This buffer layer must be highly resistive. Unfortunately, the defects and impurities in unintentionally-doped GaN increase the microwave losses and off-state leakage currents of FETs that incorporate the GaN because they provide a pathway for leakage through a GaN buffer layer. To solve the current leakage problem, iron (Fe) atoms have been incorporated as dopants in semi-insulating GaN during metal-organic chemical vapor deposition (MOCVD) growth to introduce acceptor states that compensate for the background impurities.

In Fe doping of GaN via MOCVD, the substrate is typically first exposed to gallium- and nitrogen-containing precursor gases to establish an optimal growth condition for GaN and an Fe dopant precursor is subsequently added to the MOCVD reactor to dope the growing film of GaN. However, the Fe dopant atoms are incorporated slowly and suffer from memory and segregation effects that make the Fe dopant concentration profile difficult to control. Thus, while the use of Fe dopants has improved the leakage problem in GaN buffer layers, further improvement is needed for GaN to realize its full potential in high-frequency and high-power applications.

SUMMARY

Semi-insulating, Fe-doped group III-nitrides, such as gallium nitride, and methods for growing Fe-doped group III-nitrides on a substrate via MOCVD are provided.

One example of a semi-insulating group III-nitride structure includes: a substrate having a surface; and a group III-nitride on the surface of the substrate. The group III-nitride comprises: a substrate surface-adjacent region of the group III-nitride, wherein the group III-nitride in the surface substrate-adjacent region is free of Fe-dopant atoms or has an Fe-dopant atom concentration that is no greater than an unintentional donor impurity atom concentration of the group III-nitride; a donor-impurity-atom-compensating layer of the group III-nitride contiguous with the substrate surface-adjacent region of the group III-nitride, wherein the donor-impurity-atom-compensating layer has an Fe-dopant atom concentration that is greater than the unintentional donor impurity atom concentration of the group III-nitride and is characterized by a peak in the Fe dopant concentration, followed by a tapering in the Fe dopant concentration; and a cut-off layer contiguous with the donor-impurity-atom-compensating layer, wherein the Fe-dopant atom concentration in the cut-off layer is characterized by an Fe-dopant atom concentration that decreases by a factor of at least ten across its depth.

One example of a method of making a semi-insulating group III-nitride structure includes the steps of: placing a substrate in a chemical vapor deposition reactor chamber; and growing a group III-nitride on the substrate, wherein the group III-nitride is grown by: heating the substrate to a nucleation temperature; flowing one or more group III precursor gases with a carrier gas and a nitrogen precursor gas into the chemical vapor deposition reactor chamber, whereby a group III-nitride nucleates to form a nucleation layer on the substrate; heating the substrate and nucleation layer to a coalescence temperature that is greater than room temperature; flowing one or more group III precursor gases and the nitrogen precursor gas into the chemical vapor deposition reactor chamber for a coalescence period, whereby the group III-nitride coalesces to form a coalescence layer, wherein the formation of the nucleation layer and the onset of the formation of the coalescence layer are carried out in the absence of an Fe dopant precursor or in the presence of an Fe dopant precursor having a flux that is sufficiently low to form a substrate surface-adjacent region in the group III-nitride that is free of Fe-dopant atoms or has an Fe-dopant atom concentration that is no greater than the unintentional donor impurity atom concentration of the group III-nitride; flowing an Fe dopant precursor gas into the chemical vapor deposition reactor chamber at an Fe dopant precursor gas flux while the one or more group III precursor gases and the nitrogen precursor gas flow into the chemical vapor deposition reactor chamber to form a donor-impurity-atom-compensating layer of the group III-nitride; reducing the Fe dopant precursor gas flux while the one or more group III precursor gases and the nitrogen precursor gas flow into the chemical vapor deposition reactor chamber to continue to form the donor-impurity-atom-compensating layer of the group III-nitride, whereby the donor-impurity-atom-compensating layer has an Fe-dopant atom concentration that is greater than the unintentional donor impurity atom concentration of the group III-nitride throughout its depth and is characterized by a peak in the Fe dopant concentration, followed by a tapering in the Fe dopant concentration; and discontinuing the flow of the Fe dopant precursor gas, the group III precursor gas, and the nitrogen precursor gas.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

DETAILED DESCRIPTION

Figure 1A:
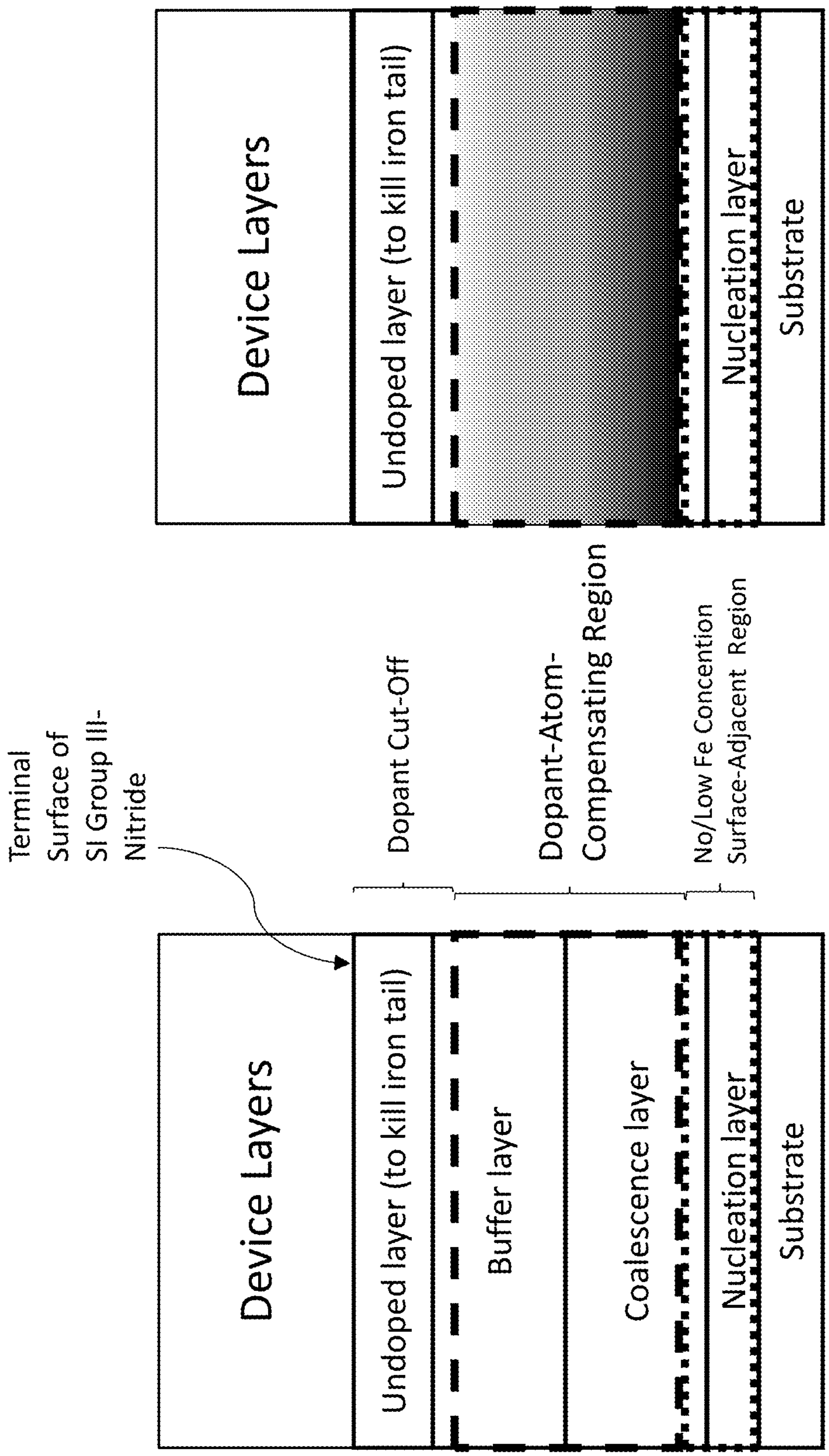
FIG. 1A is a schematic diagram of a semi-insulating, Fe-doped group III-nitride grown via MOCVD using delayed and stepwise doping.

Methods for growing semi-insulating, Fe-doped group III-nitrides on a substrate via epitaxial growth are provided. In the methods, the introduction of Fe dopants into the growing group III-nitride film is delayed until after the group III-nitride film has begun coalescence. Fe dopants are then introduced into the growing film in a stepwise process, whereby an Fe dopant precursor is introduced at a high flow rate, followed by the reduction of the Fe dopant precursor flow rate in a subsequent step. Finally, the Fe dopant precursor flow is stopped and the flow of a nitrogen precursor is increased to reduce the Fe dopant tail in the group III-nitride. The semi-insulating, Fe-doped group III-nitrides can be used as growth substrates for the growth of doped or undoped group III nitride device layers in the fabrication of a variety of electrical, optoelectrical, and optical devices, including transistors, light-emitted diodes and diode lasers.

The Fe dopant atoms are introduced to compensate for donor impurity atoms that are unwanted and are introduced unintentionally into the group III-nitride. These donor impurities can act as n-type dopants and degrade the semi-insulating quality of the group III-nitrides. For example, unintentionally doped GaN is commonly grown as n-type doped as a result of the introduction of shallow donor impurity atoms from the underlying substrate or another impurity source during high-temperature processing.

The present methods rely on delayed and step-wise Fe doping to produce a unique Fe dopant concentration profile through the depth of the semi-insulating group III-nitride film. This Fe dopant profile includes a thin Fe-free or minimally Fe-doped region at the substrate/group III-nitride interface, referred to herein as a substrate-adjacent region, then a donor-impurity-atom-compensating region in which the Fe-dopant concentration increases to a peak, followed by a tapering of the Fe-dopant concentration, and finally, a steep drop in the Fe-dopant concentration. Throughout the depth (thickness) of the donor-impurity-atom-compensating region, the Fe dopant concentration is greater than the concentration of donor atom impurities in the group III-nitride. In some embodiments of the semi-insulating structures, the Fe-dopant concentration in the donor-impurity-atom-compensating region is at least three times the impurity concentration in the group III-nitride film. The donor-impurity-atom-compensating region fully offsets (compensates for) donor atom impurities in the group III-nitride, including in the region near the substrate/group III-nitride interface. The overall result is a semi-insulating group III-nitride having a high crystal quality, high resistivity, and an overall Fe dopant concentration that is lower than that in corresponding group III-nitride films that are made without the delayed and stepwise Fe dopant introduction. By way of illustration, semi-insulating group III-nitrides, including Ga-polar and N-polar GaN, having a root mean square surface roughness of 3 nm or lower and a resistivity of 100 kΩ or greater, including 1 MΩ or greater, can be grown using the methods described herein.

A schematic diagram of a heterostructure comprising a semi-insulating group III-nitride grown on a substrate using delayed and stepwise Fe doping is shown in FIG. 1A, left and right panels. The heterostructure includes: a substrate; a non-extrinsically doped or minimally extrinsically doped group III-nitride nucleation layer; a group III-nitride coalescence layer, the lower portion of which is non-extrinsically doped or minimally extrinsically doped; a donor-impurity-atom-compensating Fe-doped region (dashed line) of the group III-nitride, and a dopant cut-off region. The non-/low-extrinsically doped group III-nitride of the nucleation and coalescence layers define a surface-adjacent region (dotted line) in the structure. The donor-impurity-atom-compensating Fe-doped region begins in the coalescence layer and extends upward beyond the coalescence layer and into a layer of continued vertical epitaxial group III-nitride growth (the buffer layer). In the figure, a generic device comprising various device layers is disposed on the terminal surface of the semi-insulating group III-nitride. In the right panel of FIG. 1A, the donor-impurity-atom-compensating region is shaded to represent a gradient in the Fe dopant concentration through the depth of this region.

Figure 1B:
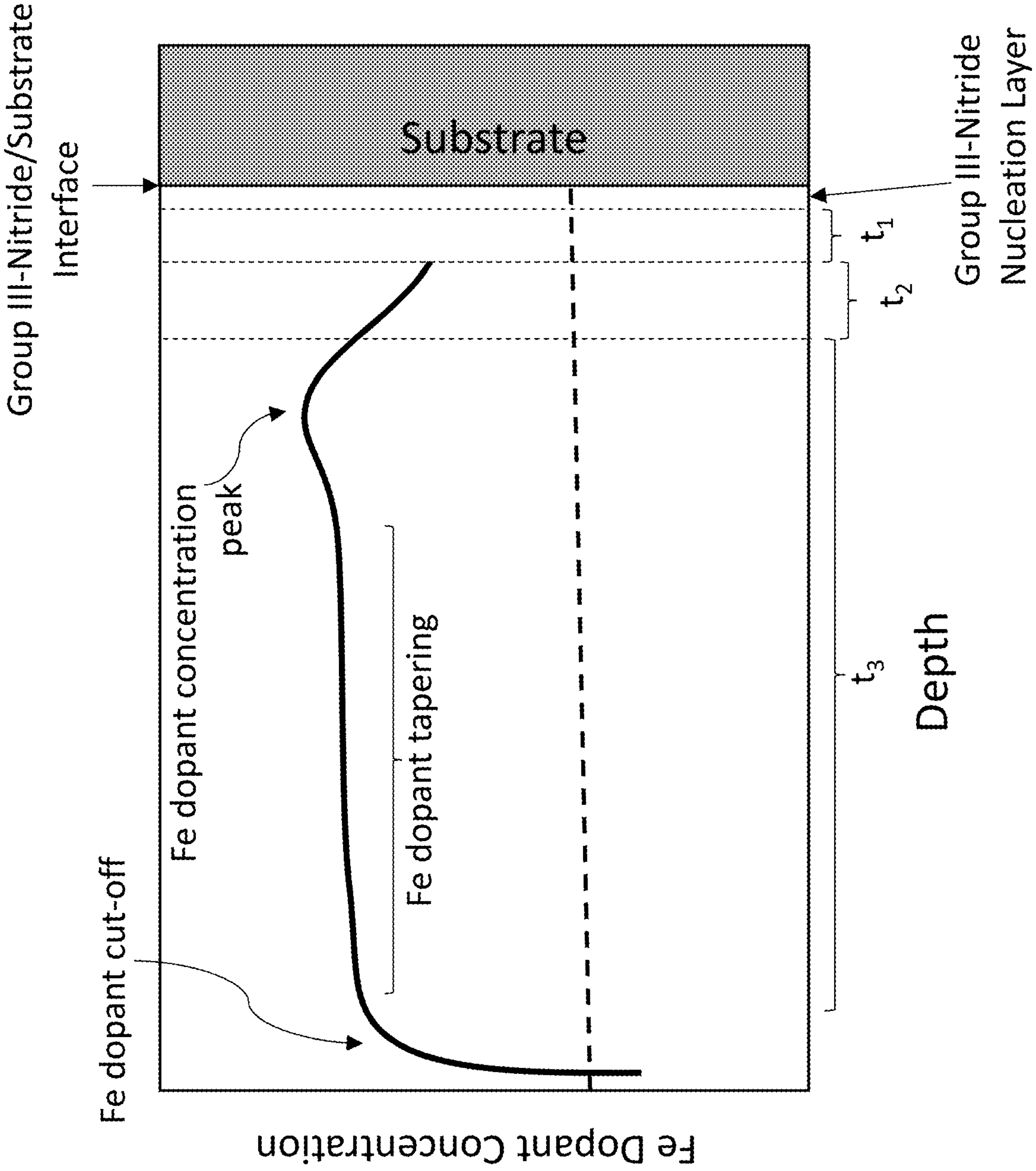
FIG. 1B is a schematic diagram showing a depth profile of the iron dopant concentration of the semi-insulating, Fe-doped group III-nitride of FIG. 1A.

A schematic diagram of a cross-sectional depth profile of the heterostructure of FIG. 1A is shown in FIG. 1B (excluding the device layers). As illustrated in the figure, the depth profile is characterized by an extrinsic dopant-free or minimally extrinsically doped surface-adjacent region and a Fe dopant concentration profile that increases to a peak, followed by a tapering in the Fe dopant concentration, and, finally, a sharp cut-off. The dotted line in the figure represents the impurity donor atom (e.g., oxygen and/or silicon atoms) concentration.

The methods can be used to grow semi-insulating, Fe-doped N-polar or Fe-doped Ga-polar GaN, or other group III-nitrides, on a variety of substrates. However, these methods are particularly useful for the growth of semi-insulating N-polar or Ga-polar GaN, or other group III-nitrides, on oxygen-containing or silicon-containing substrates, such as sapphire, silicon, or silicon carbide, because the methods can introduce high concentrations of Fe dopant atoms as deep acceptors into the GaN to compensate for the oxygen and silicon donor impurities introduced into the group III-nitride by such substrates.

As used in this description, the term "group III-nitride" is defined broadly to include group III-nitrides composed of only one or more group III elements and nitrogen, as well as transition metal nitrides alloyed with one or more group III elements. In portions of the disclosure provided herein, including the Example, group III-nitrides are exemplified with a focus on gallium nitride. However, the methods can be used to grow other group III-nitrides by replacing gallium precursors in the MOCVD growth processes with a different group III precursor and/or transition metal precursor or by adding different group III precursors and/or transition metal precursors to the epitaxial growth process. Different group III precursors and transition metal precursors would be identifiable by those skilled in the art. Thus, the methods can be used to grow, for example, semi-insulating, Fe-doped AlN, InGaN, AlGaN, AlInN, AlInGaN, h-BN, BGaN, BAlN, BAlGaN, AlScN, InN, ScN, AlInScN, InScN, GaScN, InGaScN, InScN, YN, AlYN, GaYN, GaInYN, AlInYN, and AlGaYN, as well as GaN.

Figure 2:
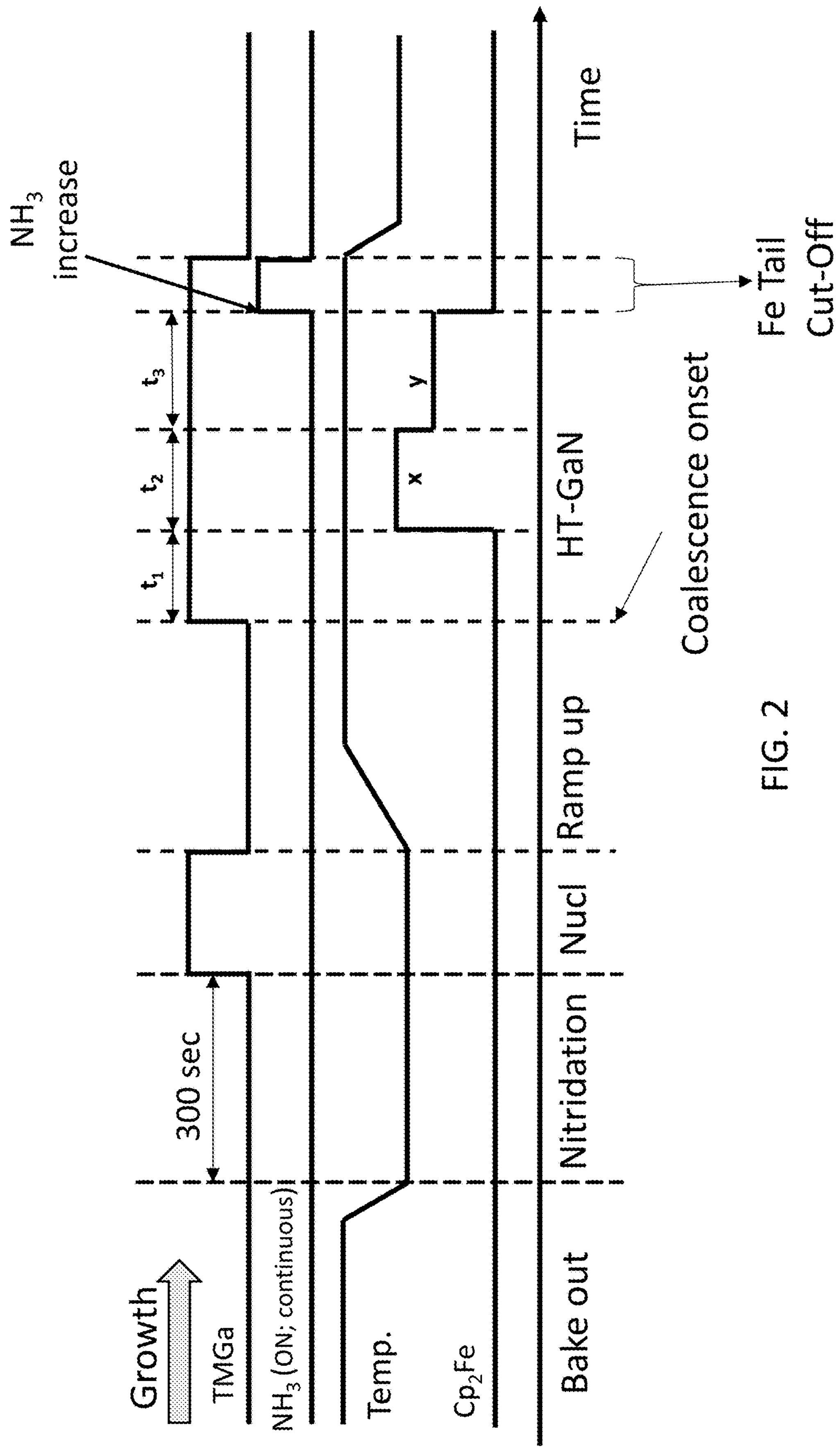
FIG. 2 shows an illustrative MOCVD process flow for the growth of semi-insulating, Fe-doped GaN.

An illustrative vapor deposition process flow for the growth of a semi-insulating, Fe-doped group III-nitride using the delayed and stepwise Fe doping method is shown in FIG. 2. (The specific precursors shown in FIG. 2 and the growth of GaN as a group III-nitride are for illustrative purposes only. Other groups III-nitrides can be grown using the same process flow.) In preparation for group III-nitride growth, a reactor chamber housing a substrate upon which the semi-insulating, Fe-doped group III-nitride is to be grown undergoes a high-temperature bake-out and a flow of a nitrogen precursor gas (e.g., $NH_3$) into the reactor chamber is initiated. After the bake-out, the nitrogen precursor gas continues to flow to carry out the nitridation of the substrate surface.

Next, while the nitrogen precursor gas flows into the reactor chamber, one or more group III precursor gases (e.g., trimethylgallium (TMGa)) are introduced into the reactor chamber to initiate the nucleation (nucl.) of a group III-nitride film on the substrate surface at a nucleation temperature. The nucleation layer is thin, typically having a thickness of 20 nm or less, including 10 nm or less. The nucleation layer is desirably grown in the absence of extrinsic dopant sources to produce a non-extrinsically doped nucleation layer. However, it may be possible to achieve the advantages of the inventions described herein even if a very low concentration of extrinsic dopant sources are present during the nucleation phase to produce a minimally-extrinsically doped nucleation layer, provided that the concentration of extrinsic (e.g., Fe) dopants in a minimally-extrinsically-doped nucleation remain low to produce a high-quality crystal. At such low levels, extrinsic dopants are not sufficient to fully compensate for the donor impurities in the group III-nitride. Therefore, for the purposes of this disclosure, a "minimally-doped" layer or region is defined as a layer or region having an extrinsic dopant (e.g., Fe dopant) concentration that is no greater than—and in some embodiments, is lower than—the donor atom impurity concentration in the group III-nitride.

Typically, after nucleation, the flow of the group III-nitride precursor gas is paused while the temperature of the substrate and nucleated group III-nitride film is ramped up to prepare for continued film growth via coalescence, which takes place at a higher temperature (HT) than film nucleation. Once the coalescence temperature is reached, the flow of the group III-nitride precursor gas is resumed and the growth of the group III-nitride film continues via coalescence. (The onset of coalescence may be identified in an vapor-deposited (e.g., MOCVD-grown) group III-nitride via reflectance measurements and, because the group III-nitride coalescence layer is characterized by a lower defect density than the group III-nitride nucleation layer, the two layers can be distinguished in transmission electron microcopy images of the heterostructures, where the interface between the nucleation and coalescence layers will be delineated in the image.)

Like the nucleation layer, the coalescence layer is initially desirably grown in the absence of extrinsic dopant sources or with a very low flux of extrinsic dopant sources to produce a non-extrinsically or minimally-doped layer. However, during the early phase of coalescence the concentration of extrinsic (e.g., Fe) dopants in a minimally-extrinsically-doped lower portion coalescence layer must remain low to produce a high-quality crystal and, therefore, are not sufficient to fully compensate the donor impurities in the group III-nitride.

The concentration of Fe dopants that constitute a minimally-doped nucleation layer or a minimally-doped region in the coalescence layer will vary depending on the concentration of impurity atoms in the group III-nitride being grown. By way of illustration only, Fe dopant concentrations of less than $1\times10^{17}$ $cm^{-3}$ or less than $1\times10^{17}$ $cm^{-3}$ may qualify as minimal dopant concentrations for some group III-nitrides, including GaN. This includes embodiments of the group III-nitrides having minimally-doped group III-nitride layers with an Fe dopant concentration in the range from $1\times10^{14}$ $cm^{-3}$ to $1\times10^{16}$ $cm^{-3}$.

Because the epitaxially-grown group III-nitrides are allowed to nucleate and commence coalescence in the absence or substantial absence of extrinsic dopant atoms, the structural crystal quality of the group III-nitrides is improved relative to the group III-nitride grown with extrinsic doping from the outset, with a lower density of threading dislocations, a lower density, or absence, of hexagonal hillocks, and a lower root-mean-square (rms) surface roughness. (As used herein, the term "substantial absence of extrinsic dopant atoms" is defined as a dopant atom concentration or flux that is sufficiently low to produce a group III-nitride that qualifies a "minimally-doped.") The improved crystal quality throughout the group III-nitride layer can be attributed, at least in part, to the improved crystal quality of the thin extrinsic dopant-atom-free or minimally-doped substrate surface-adjacent region in the group III-nitride. This Fe dopant-free or minimally-doped region of the group III-nitride is very thin to ensure that the overlying donor-atom-impurity-compensating Fe-doped group III-nitride can still provide sufficient donor impurity compensation close to the substrate/group III-nitride interface. For this reason, the coalescence of the group III-nitride film growth is typically allowed to continue until the thickness of the group III-nitride is increased by an additional thickness of no greater than 30 nm. In some embodiments of the methods, the group III-nitride is grown to a thickness of from 5 nm to 30 nm, including thicknesses in the range from 10 nm to 20 nm, after the onset of coalescence before the iron dopant precursor is introduced into the reactor.

Next, the first step of the stepwise Fe doping is initiated by introducing an Fe dopant precursor gas into the reactor chamber at an initial flow rate (flux) or—in the case where the early stages of coalescence is carried out with minimal Fe-doping—by significantly increasing the flux of an Fe dopant precursor. The Fe atoms incorporated as dopants in the group III-nitrides introduce acceptor states that compensate for donor impurity atoms, such as oxygen and/or silicon atoms, thereby reducing leakage current through the semi-insulating group III-nitride and enabling a high resistivity.

Figure 3A:
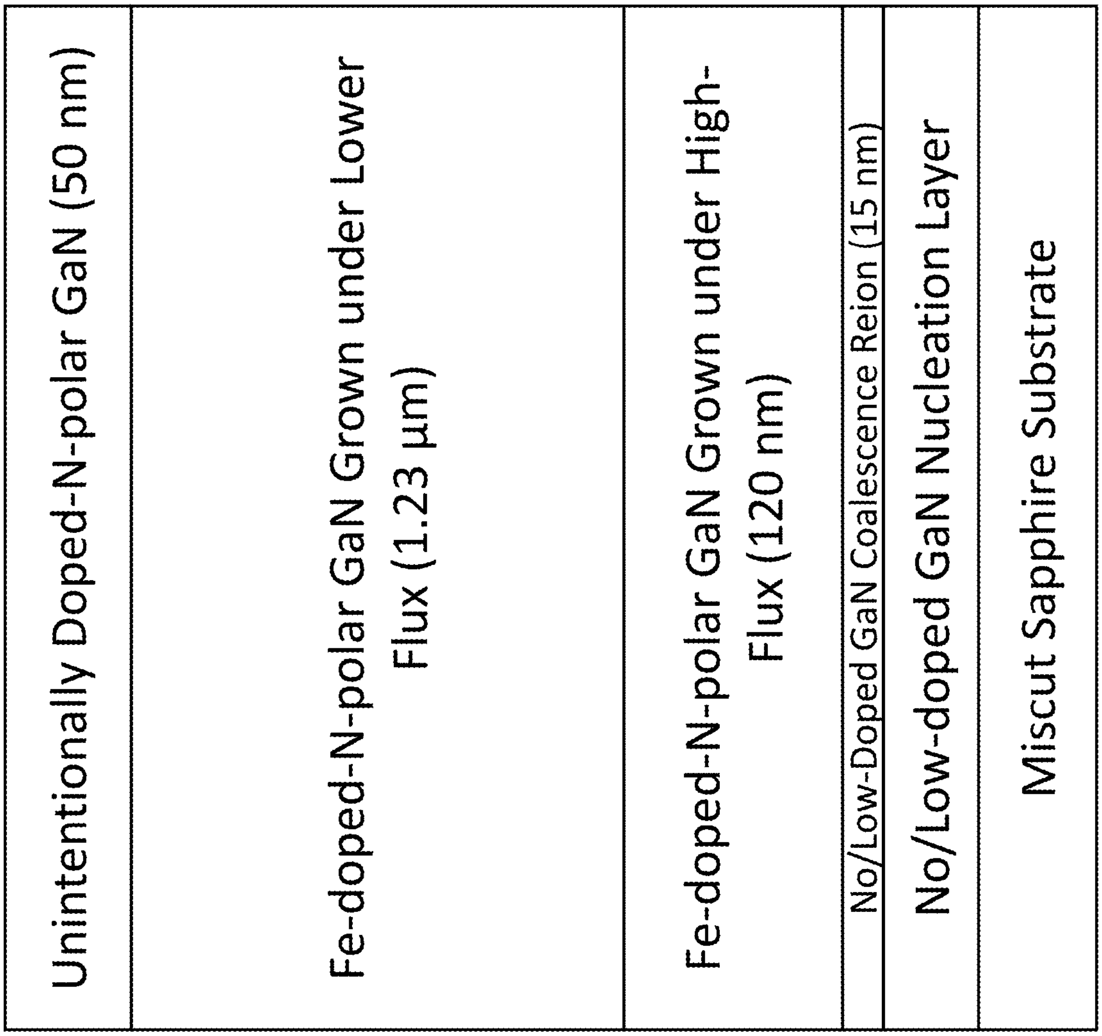
FIG. 3A is a schematic diagram of semi-insulating, Fe-doped GaN grown via MOCVD using delayed and stepwise doping, in accordance with the Example.

Depending upon the period of the delay ($t_1$), the Fe dopant precursor gas may be introduced as the group III-nitride film is still undergoing coalescence or during a post-coalescence, sustained vertical growth stage. In the former case, the coalescence layer will have a Fe-dopant free or minimally-doped coalescence region and an overlying impurity compensating Fe-doped region, while in the latter case, the entire coalescence layer will be Fe-dopant free or minimally-doped. After the initial period of doping ($t_2$), the flow rate (flux) of the Fe dopant precursor is reduced and the Fe doping of the group III-nitride continues for a time ($t_3$) until a desired film thickness is reached, at which point the flow of the Fe dopant precursor gas is discontinued to end the growth of the donor-impurity-atom-compensating region. The reduction in the Fe dopant precursor flux may be carried out in a single step, as shown in FIG. 3, or over multiple steps, or as a gradual reduction rather than in a literal "step". The donor-impurity-atom-compensating group III-nitride region can be quite thick, having, for example, a thickness (depth) of 0.5 micrometer (μm) or greater, including thicknesses in the range from about 0.5 μm to about 50 μm, and from about 1 μm to about 5 μm. To cut off the Fe dopant concentration tail in the depth profile of the groups III-nitride, the flow of the nitrogen precursor gas may then be increased while the group III precursor gas continues to flow.

The increased Fe dopant precursor flux and the thinness of the underlying non- or minimally Fe-doped layers, enables a rapid increase in the Fe dopant concentration, including, for example, in increase to least three times the unintentional donor impurity atom concentration, within a relatively narrow thickness of group III-nitride. For example, within a depth in the range from 10 nm to 100 nm, or even 10 nm to 50 nm, from the substrate/group III-nitride interface, the group III-nitride can be achieved an Fe dopant concentration that is at least three times the unintentional donor impurity atom concentration in the group III-nitride. However, while a high Fe dopant concentration is generally desirable to offset donor impurities, it is sufficient to have an Fe dopant concentration that fully compensates for the impurity-induced carriers in the group III-nitride. If the Fe dopant concentration becomes too high, it is possible to degrade the structural crystal quality of the group III-nitride. Therefore, after the initial high-flow-rate Fe doping step, the flow rate of the Fe precursor gas is decreased to reduce the Fe dopant concentration. This two-step Fe doping approach produces a peak in Fe dopant concentration near the group III-nitride/substrate interface, followed by a modest and gradual tapering of the Fe dopant concentration. While the Fe dopant concentration decreases in the tapered region of the group III-nitride, the Fe dopant concentration remains sufficient to fully offset the donor impurity atoms in the material.

To effectively fully offset donor impurity atoms, the concentration of dopant atoms introduced during the stepwise Fe doping should be significantly higher than the impurity atom concentration. It is for this reason that the Fe-dopant concentration in the peaked and tapered portions of the Fe-dopant depth profile is at least three times the concentration of the donor impurity atoms in the group III-nitride. This includes embodiments in which the Fe-dopant concentration in the peaked and tapered portions of the Fe-dopant depth profile are least five times the concentration of the donor impurity atoms in the group III-nitride. For example, the Fe-dopant concentration in the peaked and tapered portions of the Fe-dopant depth profile may be three to ten times greater than the concentration of the donor impurity atoms in the group III-nitride.

The concentration of Fe dopants that constitute a donor-atom-impurity-compensating Fe-doped region will vary depending on the concentration of donor impurity atoms in the group III-nitride being grown. By way of illustration only, Fe dopant concentrations of at least $1\times10^{16}$ cm$^{-3}$, including Fe dopant concentrations of at least $1\times10^{17}$ cm$^{-3}$ and at least $1\times10^{18}$ cm$^{-3}$, may qualify as a donor-atom-impurity-compensating concentration for some group III-nitrides, including GaN. This includes embodiments of the group III-nitrides having donor-atom-impurity-compensating Fe-doped region with a peak Fe dopant concentration in the range from $1\times10^{18}$ cm$^{-3}$ to $1\times10^{20}$ cm$^{-3}$ and in an Fe dopant concentration in the tapered region in the range from $1\times10^{16}$ cm$^{-3}$ up to the peak concentration, including, for example, the range from $2\times10^{17}$ cm$^{-3}$ to $1\times10^{18}$ cm$^{-3}$.

An impurity atom compensating Fe dopant concentration will continue to be incorporated into the group III-nitride until the flow of the Fe dopant precursor ceases and the nitrogen precursor flow is increased, causing the Fe-dopant concentration in the group III-nitride to drop rapidly at the terminal surface of the semi-insulating group III-nitride layer (Fe Tail Cut-Off). At the cut-off, the Fe dopant concentration will drop sharply from a donor-impurity-atom-compensating concentration to a concentration that is lower than the donor atom impurity concentration in the material. This concentration decrease will take place over a narrow thickness. For example, this Fe-dopant concentration cut-off may take place over a thickness (depth) of 50 nm or less.

Some embodiments of the heterostructures made by delayed and stepwise Fe doping include a non-extrinsically or minimally-extrinsically doped GaN nucleation layer on a sapphire substrate, a non-extrinsically or minimally-extrinsically doped region in a group GaN coalescence layer, and an Fe-doped GaN region having a peak Fe dopant concentration close to the GaN/sapphire interface, followed by a decreasing Fe dopant atom concentration in a tapered region, and sharp Fe dopant cut-off. An MOCVD-based growth process for such a heterostructure is described in detail in the Example.

The characteristics of the semi-insulating, Fe-doped GaN, including the dopant concentrations and layer or region thicknesses can vary depending on the intended application. However, in some embodiments of the semi-insulating, Fe-doped GaN, the Fe-dopant concentration throughout the depth of the donor-atom-impurity-compensating region in the group III-nitride is at least $1.0\times10^{18}$ cm$^{-3}$. By way of illustration the Fe dopant concentration in throughout this region may be the range from $1.0\times10^{18}$ cm$^{-3}$ to $1.0\times10^{19}$ cm$^{-3}$. Semi-insulating, Fe-doped GaN grown using the delayed and stepwise Fe-doping methods can have resistivities of 100 kΩ or greater, including 1 MΩ or greater.

The delayed and stepwise Fe-doping vapor-deposition growth can also produce semi-insulating, Fe-doped GaN layer having a terminal (outer) surface with a lower surface roughness than a semi-insulating, Fe-doped GaN layer that is grown under the same conditions, but without delayed and stepwise Fe doping (i.e., grown using a constant Fe-dopant precursor flux). By way of illustration, semi-insulating, Fe-doped GaN films having a terminal surface with an rms surface roughness of less than 5 nm, less than 3 nm, or less than 2 nm over a 10 μm×10 μm surface area, as measured by AFM, can be grown. Such high-quality semi-insulating, Fe-doped GaN can be grown, for example, on a miscut sapphire substrate.

Precursors, Substrates, and Growth Conditions.

The semi-insulating group III-nitrides can be grown epitaxially using a variety of physical or chemical vapor deposition techniques, including MOCVD, molecular beam epitaxy (MBE), and plasma enhanced chemical vapor deposition (PECVD). While the discussion below focuses on MOCVD growth, it should be understood that the delayed and stepwise epitaxial growth process can be carried out using other vapor deposition techniques.

Fe Dopant Precursors.

The Fe dopant precursors used in the delayed and stepwise Fe doping methods are Fe-containing compounds that decompose on the surface of the substrate to produce Fe atoms adsorbed on the substrate surface. In MOCVD growth, the Fe dopant precursors are introduced into an MOCVD reactor chamber, typically along with an inert carrier gas, and are transported to the substrate surface via fluid transport and/or diffusion. Thus, the precursors should have a sufficiently high vapor pressure to allow for a stable and controllable gas flow into the MOCVD reactor chamber and should be sufficiently heavy to stick to the substrate surface. Examples of suitable Fe dopant precursors include bis-cyclopentadienyl-iron ($Cp_2Fe$), $Fe(TMHD)_3$ (tris(2,2,6,6-tetramethyl-3,5-heptanedionato)iron(III)), $Fe(C_{11}H_{19}O_2)_3$, and iron(III) acetylacetonate.

Group III and Nitrogen Precursors.

The group III (e.g., gallium) and nitrogen precursors are compounds that react on the surface of the substrate during the MOCVD process to produce a solid group III-nitride film and, as such, are compounds that include, for example, Ga atoms (gallium precursors) (and/or other group III atoms) or N atoms (nitrogen precursors). The group III and nitrogen precursors may include one or more group III atom-containing precursors and one or more N-containing precursors. Examples of suitable Ga-containing precursors include organometallic molecules, such as, but not limited to, TMGa or triethylgallium (TEGa). Other examples of group III precursors include trimethyl aluminum, trimethyl indium, trimethyl borate, trimethyl borane, Sc-containing precursors (for example $Cp_3Sc$ or $(MeCp)_3Sc$), and Y-containing precursors.

Examples of suitable N-containing precursors include nitrogen hydrides, such as, but not limited to, ammonia. The precursors are desirably of extremely high purity to minimize or eliminate the incorporation of unwanted impurities in the deposited film.

Substrates.

The semi-insulating, Fe-doped group III-nitrides can be grown on a variety of substrates that are suitable for epitaxial growth. For GaN, the selection of a growth surface will depend on the desired polarity of the GaN. The crystal direction [0001] of a GaN film can be either parallel or antiparallel to the growth direction, resulting in the growth of either Ga-polar or N-polar GaN, respectively. Examples of suitable substrates for the growth of N-polar or Ga-polar GaN include GaN, AlN, sapphire ($Al_2O_3$), including miscut C-plane sapphire, silicon carbide (SiC), including miscut SiC, and silicon (Si). These and other substrates may also be used to grow other group III-nitrides. The substrate upon which the group III-nitride is epitaxially grown may be a bulk substrate material or may be a layer of material that is itself grown on another underlying substrate.

The present methods are particularly useful when the substrate upon which the semi-insulating, Fe-doped group III-nitride film is grown, referred to herein as the growth substrate, contains oxygen or silicon and the MOCVD growth is carried out under high-temperature conditions. This is because, under high-temperature MOCVD growth conditions, oxygen or silicon atoms are released from the substrate and become impurities in the group III-nitride (e.g., GaN) film, where they act as n-type dopants. The high Fe atom dopant concentrations in the Fe-doped layer can compensate for these impurity atoms. MOCVD growth of N-polar GaN is an example of a MOCVD process that is carried out at a high temperature (e.g., ≥1000° C.). Therefore, when N-polar GaN is grown via MOCVD on sapphire, oxygen atoms from the sapphire are released into the N-polar GaN during high-temperature processing.

It is also desirable to use substrates that do not include carbon atoms, as those atoms may unintentionally dope the group III-nitride during MOCVD growth in a manner that is difficult to control and that results in a non-uniform carbon atom dopant profile near the interface.

MOCVD Growth Stages and Conditions.

Substrate Preparation.

In preparation for MOCVD growth, a substrate is loaded into a MOCVD reactor chamber and heated to a process temperature under hydrogen ambient, typically after an in-situ high temperature (e.g., 1200 to 1300° C.) bake-out to remove the moisture and other impurities from the chamber. Nitridation of the growth substrate surface may then be carried out by the exposure of said surface to a nitrogen precursor gas at a nitridation temperature. During nitridation, nitrogen atoms from the nitrogen precursor molecules replace oxygen atoms at the surface. Nitridation is typically carried out a temperature lower than the bake-out and coalescence temperatures. Illustrative nitridation temperatures include temperatures in the range from 1100° C. to 1200° C. for N-polar GaN and 450° C. to 600° C. for Ga-polar GaN.

During MOCVD growth, a solid film of the group III-nitride is formed epitaxially on a substrate surface by the thermal decomposition of the group III precursors, nitrogen precursors, and—for the Fe-doped layer, Fe precursors on the surface. The precursor molecules adsorb onto the surface of the substrate or growing film where they undergo heterogeneous and/or decomposition reactions. As a result of these reactions, gallium and nitrogen atoms from the precursors remain on the surface as adatoms, while other by-product molecules desorb. By way of illustration, ammonia molecules adsorbed on the surface decompose to produce nitrogen adatoms and hydrogen molecules desorb into the gas phase. MOCVD growth takes place through a number of stages.

The MOCVD reactor conditions, including precursor fluxes, can be adjusted for each stage of growth to realize a semi-insulating Fe-doped group III-nitride buffer layer having electronic properties suitable for an intended application.

Suitable MOCVD reactor conditions and methods for determining suitable MOCVD reactor conditions for semi-insulating, Fe-doped GaN are presented in the Example. Additional guidance may be found in the literature on MOCVD growth of group III-nitrides, such as GaN. (See, for example, Heikman, Sten, et al. "Growth of Fe doped semi-insulating GaN by metalorganic chemical vapor deposition." *Applied Physics Letters* 81.3 (2002): 439-441.) Exemplary ranges for various MOCVD reactor conditions for the growth of GaN are presented below for guidance. However, reactor conditions outside of the ranges presented here can be used. This guidance can also be applied to other group III-nitrides.

GaN Nucleation.

In the earliest phase of MOCVD, the Ga and N adatoms are mobile and migrate across the surface of the substrate until they reach a high-energy surface site or trap site on which the adatom becomes immobilized. The immobilized atoms provide the starting point for the nucleation phase of the MOCVD process. During the nucleation phase, GaN nuclei ("islands") grow in the vertical and lateral directions on the substrate surface via the incorporation of mobile Ga and N adatoms. Nucleation layers typically have a thickness in the range from about 10 nm to about 20 nm. However, thicknesses outside of this range are possible.

Suitable flow rates for the gallium precursors during film nucleation include flow rates in the range from 30 micro mole per minute (μmol/min) to 60 μmol/min for Ga-polar GaN, while flow rates in the range from 10 μmol/min to 50 μmol/min may be preferable for N-polar GaN.

Suitable flow rates for the nitrogen-containing precursors during GaN film nucleation include flow rates in the range from 50 mmol/min to 200 mmol/min. This includes flow rates in the range from 90 mmol/min to 180 mmol/min.

Suitable process pressures during film nucleation include pressures in the range from 50 mbar to 600 mbar. This includes pressures in the range from 50 mbar to 600 mbar for Ga-polar GaN, while pressures in the range from 50 mbar to 300 mbar may be preferable for N-polar substrate growth.

Nucleation temperatures are temperatures above room temperature (~23° C.) and are typically in the range from about 500° C. to 1200° C. This includes nucleation temperatures in the range from 450° C. to 660° C. for Ga-polar GaN, and 950° C. to 1200° C. for N-polar GaN growth.

GaN Coalescence.

As they grow horizontally, the GaN nuclei begin to coalesce into a coherent film layer. This begins the phase of the MOCVD known as coalescence. As coalescence continues, complete coalescence of the nuclei is eventually achieved and sustained vertical growth of GaN from the coalesced film commences and is continued to form a buffer layer until a semi-insulating GaN film having a desired thickness is formed.

Suitable flow rates for the gallium-containing precursors during film coalescence include flow rates in the range from 50 μmol/min to 250 μmol/min. This includes flow rates in the range from 90 μmol/min to 210 μmol/min.

Suitable flow rates for the nitrogen-containing precursors during film coalescence include flow rates in the range from 50 mmol/min to 200 mmol/min. This includes flow rates in the range from 90 mmol/min to 180 mmol/min.

Suitable process pressures during film coalescence include pressures in the range from 50 mbar to 600 mbar. This includes pressures in the range from 50 mbar to 600 mbar for Ga-polar GaN, while pressures in the range from 50 mbar to 300 mbar may be preferable for N-polar GaN growth.

Suitable coalescence temperatures are temperatures above room temperature (~23° C.), and typically include temperatures in the range from 950° C. to 1600° C. This includes temperatures in the range from 1000° C. to 1300° C.

Stepwise Fe Doping.

Suitable flow rates for the Fe-dopant precursors during the high-flux doping step include flow rates in the range from 50 nmol/min to 150 nmol/min. This includes flow rates in the range from 55 nmol/min to 90 nmol/min.

Suitable flow rates for the Fe-dopant precursors during the lower-flux doping step include flow rates in the range from 15 nmol/min to 55 nmol/min. This includes flow rates in the range from 25 nmol/min to 45 nmol/min.

The temperature ranges for the doping steps will typically be the same as those used during the dopant-free or minimal-doping coalescence growth.

Sustained Vertical GaN Film Growth.

Sustained growth of the Fe-doped GaN is continued until a semi-insulating, Fe-doped GaN film having a desired thickness is achieved. By way of illustration, for use as buffer layers in a HEMT, the semi-insulating, Fe-doped GaN sub-layer having the lower Fe concentration typically has a thickness in the range from 1 μm to 15 μm, including in the range from 1 μm to 10 μm.

MOCVD Reactors.

The reactions of the precursors on the substrate surface are thermally driven and, therefore, the MOCVD reactor is equipped with a heater, or other energy source, in thermal communication with the substrate to heat the substrate to a temperature that promotes these reactions and enables the adatoms to migrate on the surface, which produces nucleation and, subsequently, coalescence and continuous film growth. Suitable energy sources include, but are not limited to, resistive heaters, inductive heaters, and infrared lamps. The MOCVD reactor will also include a vacuum pump in fluid communication with the reactor chamber to remove the by-product gasses and maintain the chamber pressure at a desired process pressure during film growth. Optionally, a rotating stage may be used to rotate the substrate during MOCVD growth to improve the uniformity of the deposition.

The precursors in MOCVD are introduced into the reaction chamber along with an inert carrier gas, and are transported to the substrate surface via fluid transport and/or diffusion. Therefore, the MOCVD reactors are equipped with the valves, tubing, flow controllers, and the like to facilitate the controlled introduction of the carrier gases and gaseous precursors into the chamber.

The MOCVD reactor may be a horizontal or a vertical reactor. In a horizontal reactor, the precursor gases are introduced at the side of the reactor chamber, through one or more gas inlets in a side-wall of the chamber. The precursors then diffuse in a horizontal direction toward the heated growth substrate, which may be mounted in a horizontal orientation or tilted toward the incoming gas flow. In a vertical reactor, the precursor gases are introduced at or near the top of the reactor chamber, through one or more gas inlets in the ceiling or top side wall of the chamber. The ability to carry out the present MOCVD growth methods in a vertical MOCVD reactor is advantageous because, relative to a horizontal MOCVD reactor, a vertical MOCVD reactor provides a narrow and homogeneous high temperature zone at the substrate surface, which results in more homogeneous growth.

Example

This example illustrates the MOCVD growth of semi-insulating, Fe-doped GaN on miscut sapphire using delayed and stepwise Fe doping. A schematic diagram showing the growth layers is provided in FIG. 3A.

The iron (Fe)-doped semi-insulating N-polar GaN epitaxial layers were deposited using MOCVD on a 4° miscut sapphire substrate. Trimethylgallium (TMGa) and ammonia ($NH_3$) were used as group III and group V precursors. Ferrocene ($Cp_2Fe$) was used a source of Fe dopants for obtaining semi-insulating behavior. The miscut sapphire sample was heated at 1300° C. and nitridation was performed prior to a growth of a high-temperature nucleation layer using a temperature of 1145° C., TMGa flow rate of 22 μmol/min, $NH_3$ flow of 178 mmol/min at a reactor pressure of 100 mbar under $N_2$ ambient. Next, the temperature was increased to 1270° C. for the growth of 15 nm coalescence layer using a TMGa flow of 136 μmol/min and $NH_3$ flow of 78 mmol/min under $H_2$ ambient. Following the coalescence layer, a highly Fe doped GaN layer of 120 nm thickness using a $Cp_2Fe$ flow of 100 nmol/min was deposited. After that the $Cp_2Fe$ flow rate was decreased to 45 nmol/min for the deposition of low Fe-doped N-polar GaN layer of 1.23 μm thickness. Finally, an unintentionally doped (UID) N-polar GaN layer of 50 nm thickness was grown with increased $NH_3$ flow (134 mmol/min) to reduce the memory effect of the Fe dopant.

Hall and Capacitance-Voltage (CV) measurements were performed for determining the sheet resistance of the materials. Both measurements proved that the Fe-doped N-polar GaN films were semi-insulating. The material quality was measured using an X-ray diffraction tool (Panalytical Empyrean). Omega rocking curves at GaN (002) and (102) planes were measured for obtaining the full width half max (FWHM) of the semi-insulating N-polar GaN. Finally, the surface roughness of the materials were measured using atomic force microscopy (Bruker Icon).

Figure 3B:
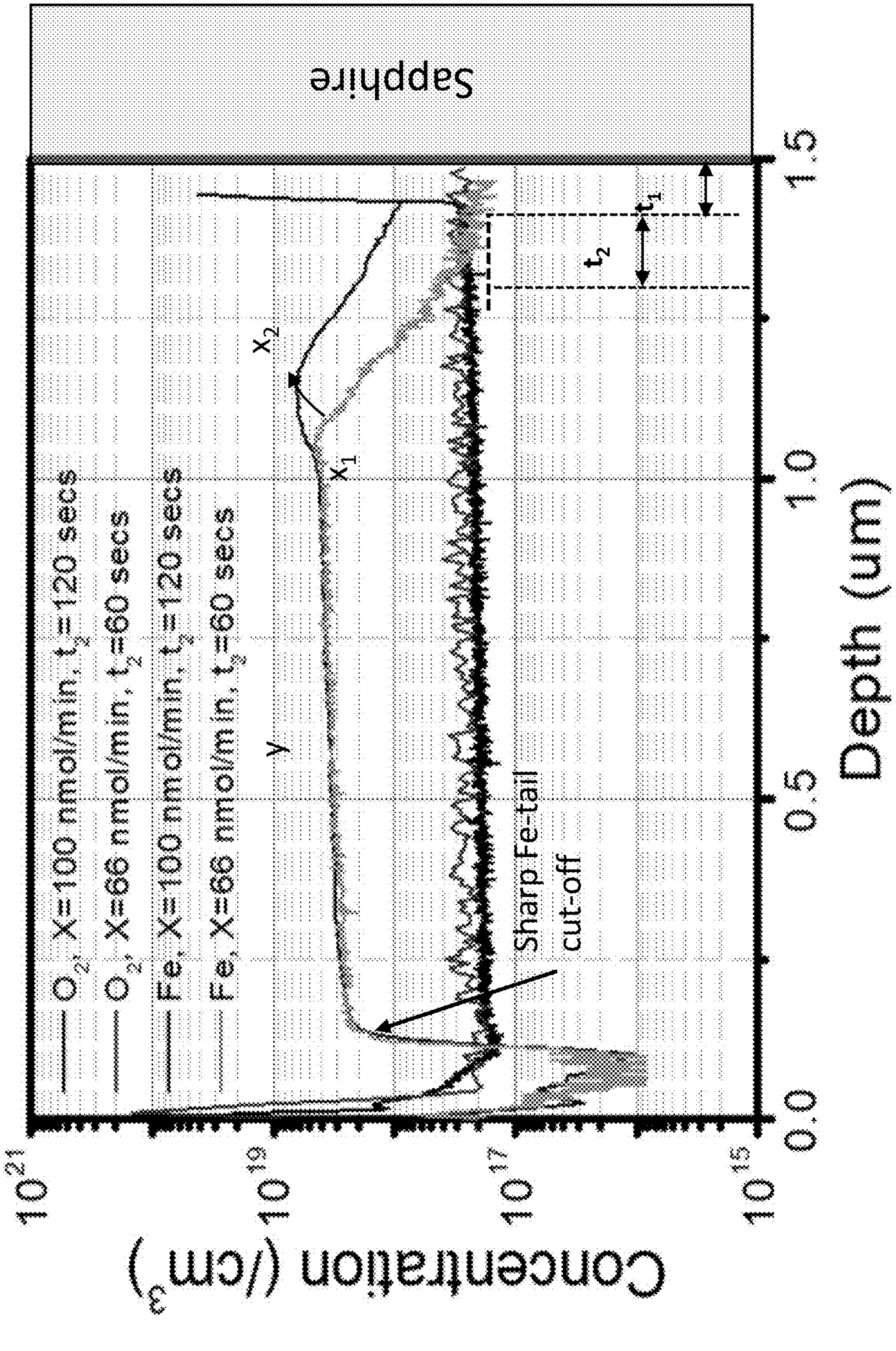
FIG. 3B is a depth profile of the Fe dopant concentration of semi-insulating, Fe-doped GaN grown via MOCVD under different flow conditions using delayed and stepwise doping, in accordance with the Example.

FIG. 3B is a depth profile of the Fe dopant concentration of the semi-insulating, Fe-doped GaN grown via MOCVD under different flow conditions using delayed and stepwise doping.

Figure 3C:
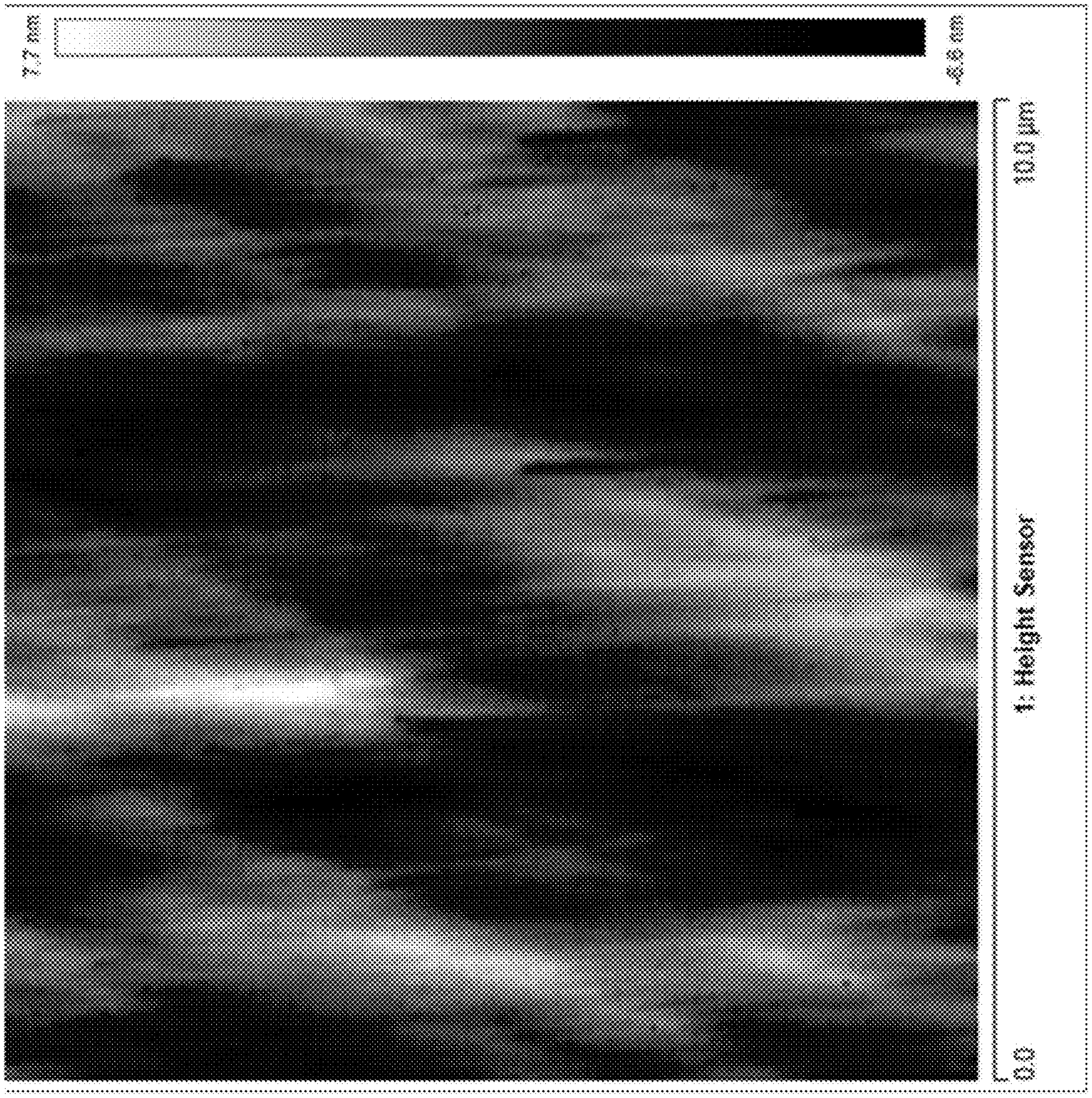
FIG. 3C is an atomic force microscopy (AFM) scan of semi-insulating, Fe-doped GaN grown via MOCVD using delayed and stepwise doping, in accordance with the Example.

FIG. 3C is an atomic force microscopy (AFM) scan of the semi-insulating, Fe-doped GaN grown via MOCVD using delayed and stepwise doping.

Unless otherwise indicated, measured and measurable quantities recited herein refer to said quantities at room temperature (23° C.) and atmospheric pressure.

Unless otherwise indicated, measured and measurable quantities recited herein refer to said quantities at room temperature (23° C.) and atmospheric pressure.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" can mean only one or can mean "one or more." Embodiments of the inventions consistent with either construction are covered.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A semi-insulating group III-nitride structure comprising:

a substrate having a surface; and a group III-nitride on the surface of the substrate, the group III-nitride comprising:

a substrate surface-adjacent region of the group III-nitride, wherein the group III-nitride in the surface substrate-adjacent region is free of Fe-dopant atoms or has an Fe-dopant atom concentration that is no greater than an unintentional donor impurity atom concentration of the group III-nitride;

a donor-impurity-atom-compensating layer of the group III-nitride contiguous with the substrate surface-adjacent region of the group III-nitride, wherein the donor-impurity-atom-compensating layer has an Fe-dopant atom concentration that is greater than the unintentional donor impurity atom concentration of the group III-nitride and is characterized by a peak in the Fe dopant concentration, followed by a tapering in the Fe dopant concentration; and a cut-off layer contiguous with the donor-impurity-atom-compensating layer, wherein the Fe-dopant atom concentration in the cut-off layer is characterized by an Fe-dopant atom concentration that decreases by a factor of at least ten across its depth.

2. The semi-insulating group III-nitride structure of claim 1, wherein the substrate surface-adjacent region is free of the Fe dopant atoms.

3. The semi-insulating group III-nitride structure of claim 1, wherein the substrate surface-adjacent region has an Fe-dopant atom concentration of less than $1\times10^{16}$ cm$^{-3}$ and the donor-impurity-atom-compensating layer has an average Fe-dopant atom concentration of at least $1\times10^{16}$ cm$^{-3}$, as measured across the depth of the donor-impurity-atom-compensating layer.

4. The semi-insulating group III-nitride structure of claim 1, wherein the group III-nitride is gallium nitride (GaN).

5. The semi-insulating group III-nitride structure of claim 4, wherein the substrate surface-adjacent region has an Fe-dopant atom concentration of less than $1\times10^{16}$ cm$^{-3}$ and the donor-impurity-atom-compensating layer has an average Fe-dopant atom concentration of at least $1\times10^{16}$ cm$^{-3}$, as measured across the depth of the donor-impurity-atom-compensating layer.

6. The semi-insulating group III-nitride structure of claim 1, wherein the substrate comprises oxygen atoms, silicon atoms, or a combination thereof and the donor impurity atoms of the group III-nitride comprise oxygen atoms, silicon atoms, or a combination thereof.

7. The semi-insulating group III-nitride structure of claim 6, wherein the group III-nitride is gallium nitride (GaN).

8. The semi-insulating group III-nitride structure of claim 7, wherein the substrate is a sapphire substrate, a silicon substrate, a SiC substrate, or a native GaN or AlN substrate.

9. The semi-insulating group III-nitride structure of claim 4, having a resistivity of at least 100 kΩ.

10. The semi-insulating group III-nitride structure of claim 4, wherein the group III-nitride has a terminal surface with a root mean square surface roughness of no greater than 3 nm over a surface area of 10 μm by 10 μm.

11. The semi-insulating group III-nitride structure of claim 8, wherein the group III-nitride has a terminal surface with a root mean square surface roughness of no greater than 3 nm over a surface area of 10 μm by 10 μm.

12. The semi-insulating group III-nitride structure of claim 2, wherein the donor-impurity-atom-compensating layer has an average Fe-dopant atom concentration of at least $1\times10^{16}$ cm$^{-3}$, as measured across the depth of the donor-impurity-atom-compensating layer.

13. The semi-insulating group III-nitride structure of claim 1, wherein the donor-impurity-atom-compensating layer has an Fe-dopant atom concentration that is at least three times greater than the unintentional donor impurity atom concentration at a depth in a range from 10 nm to 100 nm from an interface between the substrate and the group III-nitride.

14. The semi-insulating group III-nitride structure of claim 1, wherein the donor-impurity-atom-compensating layer has an Fe-dopant atom concentration that is at least five times greater than the unintentional donor impurity atom concentration at a depth in a range from 10 nm to 100 nm from an interface between the substrate and the group III-nitride.

15. The semi-insulating group III-nitride structure of claim 13, wherein the donor impurity atoms comprise oxygen atoms, silicon atoms, or a combination thereof.

16. The semi-insulating group III-nitride structure of claim 15, wherein the group III-nitride is gallium nitride (GaN).

17. The semi-insulating group III-nitride structure of claim 1, wherein the substrate surface-adjacent region has an Fe-dopant atom concentration of less than $1\times10^{16}$ cm$^{-3}$ and the donor-impurity-atom-compensating layer has a peak Fe dopant concentration of at least $1\times10^{18}$ cm$^{-3}$.

18. The semi-insulating group III-nitride structure of claim 17, wherein the donor-impurity-atom-compensating layer has a peak Fe dopant concentration in the range from $1\times10^{18}$ cm$^{-3}$ to $1\times10^{20}$ cm$^{-3}$.

19. The semi-insulating group III-nitride structure of claim 13, wherein the cut-off layer has a depth of 50 nm or less.

20. The semi-insulating group III-nitride structure of claim 17, wherein the cut-off layer has a depth of 50 nm or less.

21. The semi-insulating group III-nitride structure of claim 1, wherein the cut-off layer has a depth of 50 nm or less.

22. The semi-insulating group III-nitride structure of claim 1, wherein the Fe dopant concentration at the peak is greater than $1\times10^{18}$ $cm^{-3}$.

23. The semi-insulating group III-nitride structure of claim 1, wherein the Fe dopant concentration in the donor-impurity-atom-compensating layer is in the range from $1\times10^{17}$ $cm^{-3}$ up to the Fe dopant concentration at the peak, as measured across the depth of the donor-impurity-atom-compensating layer.

24. The semi-insulating group III-nitride structure of claim 23, wherein the donor-impurity-atom-compensating layer has a depth in the range from 1 micron to 5 microns.

25. The semi-insulating group III-nitride structure of claim 1, wherein the donor-impurity-atom-compensating layer has a depth in the range from 1 micron to 5 microns.

* * * * *